(12) United States Patent
Na

(10) Patent No.: US 7,898,898 B2
(45) Date of Patent: Mar. 1, 2011

(54) SEMICONDUCTOR MEMORY APPARATUS HAVING A SUB-WORD LINE DRIVER FOR INCREASING AN AREA MARGIN IN THE MEMORY CORE AREA

(75) Inventor: Eun Sung Na, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 242 days.

(21) Appl. No.: 12/344,637

(22) Filed: Dec. 29, 2008

(65) Prior Publication Data

US 2009/0316513 A1 Dec. 24, 2009

(30) Foreign Application Priority Data

Jun. 24, 2008 (KR) ...................... 10-2008-0059863

(51) Int. Cl.
*G11C 8/00* (2006.01)
(52) U.S. Cl. .............................. 365/230.06; 365/189.11
(58) Field of Classification Search ............ 365/230.06, 365/189.11
See application file for complete search history.

(56) References Cited

U.S. PATENT DOCUMENTS

| | | | |
|---|---|---|---|
| 5,708,620 A | 1/1998 | Jeong | |
| 5,940,343 A | 8/1999 | Cha et al. | |
| 6,373,753 B1 * | 4/2002 | Proebsting | ............. 365/189.09 |
| 7,009,865 B2 * | 3/2006 | Kang | .......................... 365/145 |
| 7,274,618 B2 * | 9/2007 | Leung | ................... 365/230.06 |
| 7,274,619 B2 | 9/2007 | Lee et al. | |
| 2006/0152992 A1 | 7/2006 | Jung et al. | |
| 2008/0106963 A1 * | 5/2008 | Wang et al. | .................. 365/207 |

FOREIGN PATENT DOCUMENTS

| | | |
|---|---|---|
| KR | 1020000015548 A | 3/2000 |
| KR | 10-0305022 B1 | 7/2001 |
| KR | 10-0597636 B1 | 6/2006 |
| KR | 1020070090673 A | 9/2007 |

* cited by examiner

*Primary Examiner*—Son Dinh
(74) *Attorney, Agent, or Firm*—Ladas & Parry LLP

(57) ABSTRACT

A semiconductor memory apparatus with a sub-word line driver is presented which has an increased area margin in the memory core area. The sub-word line driver is configured to operate in response to activation of a main word line and in response to positive and negative sub-word line enable signals. The sub-word line driver includes a pull-up driver and a pull-down driver. The pull-up driver is configured to pull-up drive a first sub-word line to the potential level of the positive sub-word line enable signal in response to the activation of the main word line. The pull-down driver is configured to pull-down drive the first sub-word line in response to the negative sub-word line enable signal.

11 Claims, 3 Drawing Sheets

SEMICONDUCTOR MEMORY APPARATUS HAVING A SUB-WORD LINE DRIVER FOR INCREASING AN AREA MARGIN IN THE MEMORY CORE AREA

CROSS-REFERENCES TO RELATED APPLICATION

The present application claims priority under 35 U.S.C. 119(a) to Korean application number 10-2008-0059863, filed on Jun. 24, 2008, in the Korean Patent Office, which is incorporated by reference in its entirety as if set forth in full.

BACKGROUND OF THE INVENTION

1. Technical Field

The embodiments described herein relate to a semiconductor memory apparatus and, more particularly, to a semiconductor memory apparatus including a sub-word line driver.

2. Related Art

In general, a dynamic random access memory (DRAM) is equipped with a large number of memory cells in which each memory cell includes a transistor and a capacitor for storing data. Each memory cell is connected to word lines and bit lines. If the word lines are activated, the memory cells can receive or output data to and from the bit lines. The word lines are classified into main word lines and sub-word lines. One main word line is connected to a plurality of preset sub-word line drivers (e.g., 8 sub-word line drivers), and each of the sub-word line drivers is connected to one sub-word line. The sub-word lines are directly connected to a plurality of memory cells.

A row decoder is provided at a memory cell area which decodes row addresses to generate main word line enable signals and sub-word line enable signals in order to selectively activate main word lines and the sub-word lines. When the main word line enable signal is enabled, a main word-line driver activates one of the main word lines. Thereafter, among a plurality of sub-word line drivers connected to the activated main word line, the sub-word line driver that has received an enabled sub-word line enable signal activates a corresponding sub-word line to support data input/output operations of corresponding memory cells.

The configuration of the sub word-line driver performing the above operation typically includes three transistors. In detail, the sub word-line driver includes a driving unit and a sink unit. The driving unit includes two transistors to activate a corresponding sub-word line in response to activation of a corresponding main word line and a corresponding sub-word line enable signal. The sink unit includes one transistor to drop the potential of the sub-word line to a low level in a pre-charge operation in response to the sub-word line enable signal that is inverted.

However, in this type of sub-word line driver, a memory core area having an extremely small area margin can result. Accordingly, this type of the sub-word line driver configuration that includes three transistors can result in occupying a relatively large area. If the occupation area of the sub-word line driver can be reduced, an area margin of the memory core area may be increased. Accordingly, the integration degree of the semiconductor memory apparatus may also be improved. However, the number of transistors cannot be reduced because a stable potential level is needed to prevent or minimize unwanted excessive noise levels in each of the sub-word lines. Therefore, it is difficult to improve the integration degree of a semiconductor memory apparatus if blocks and apparatuses are arranged in the memory core area as described above. Accordingly, new technologies or configurations are needed to increase an area margin in the memory core area.

SUMMARY

A semiconductor memory apparatus capable of increasing an area margin of a memory core area is described herein.

A semiconductor memory apparatus capable of reducing a chip size by increasing an area margin of a memory core area is described herein.

According to one aspect, a semiconductor memory apparatus includes a sub-word line driver configured to operate in response to activation of a main word line and positive and negative sub-word line enable signals. The sub-word line driver includes a pull-up driver configured to pull-up drive a first sub-word line to a potential level of the positive sub-word line enable signal in response to the activation of the main word line, and a pull-down driver configured to pull-down drive the first sub-word line in response to the negative sub-word line enable signal.

According to another aspect, a semiconductor memory apparatus includes a first sub-word line driver; a second sub-word line driver; and a sub-word line share unit. The first sub-word line driver is configured to activate a first sub-word line in accordance to control of first positive and negative sub-word line enable signals in response to activation of a main word line. The second sub-word line driver is configured to activate a second sub-word line in accordance to control of second positive and negative sub-word line enable signals in response to the activation of the main word line. The sub-word line share unit is configured to allow the first sub-word line and the second sub-word line to share potential in response to the activation of the main word line.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
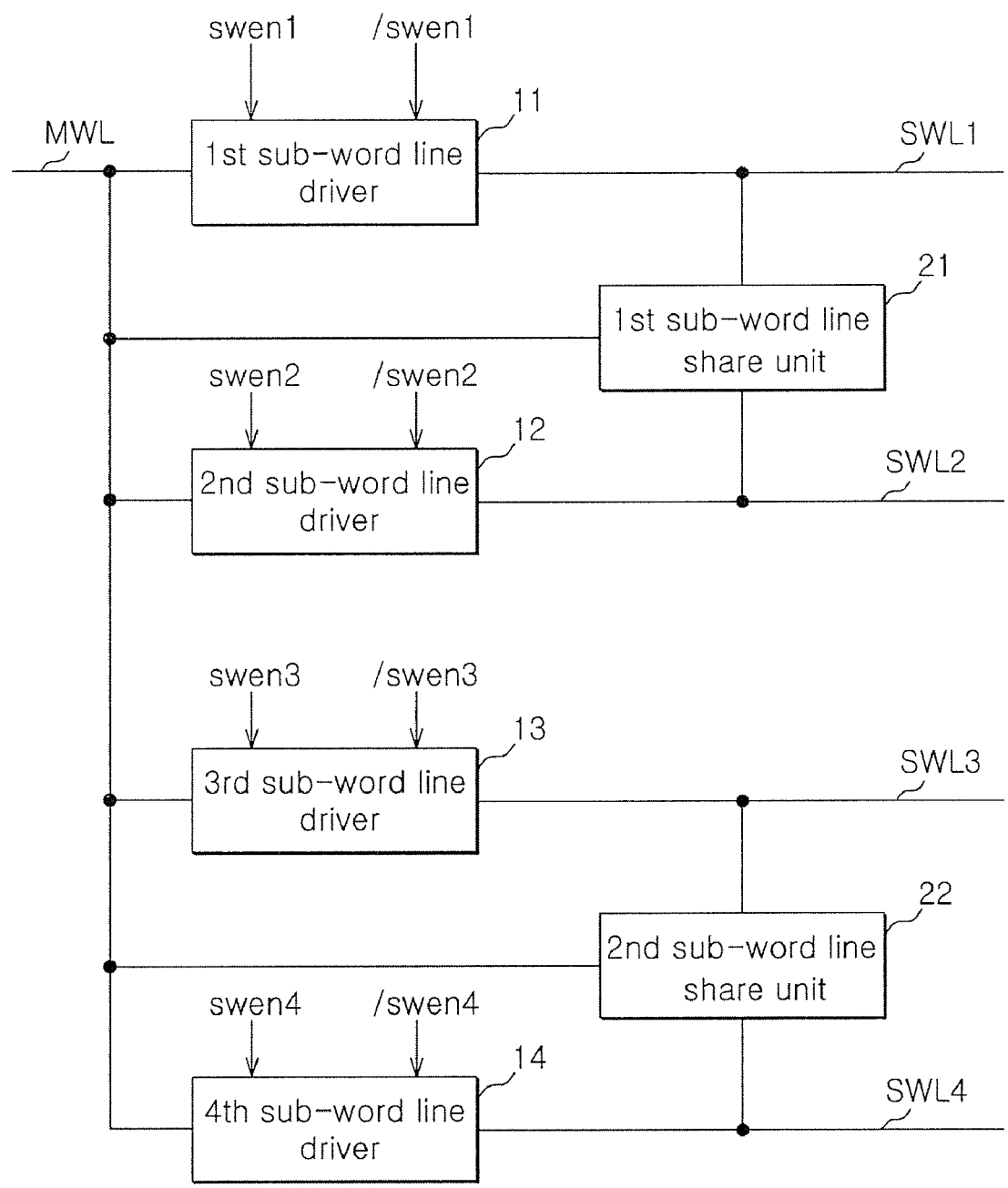
FIG. 1 is a block diagram showing an example of a semiconductor memory apparatus according to one embodiment.

FIG. 1 is a block diagram showing an example of a semiconductor memory apparatus according to one embodiment. For the purpose of explanation, FIG. 1 shows the semiconductor memory apparatus configured to control four sub-word lines.

Referring to FIG. 1, the semiconductor memory apparatus according to one embodiment can include first to fourth sub-word line drivers 11, 12, 13, and 14 and first and second sub-word line share units 21 and 22.

The first sub-word line driver 11 activates a first sub-word line 'SWL1' in accordance to the control of first positive and negative sub-word line enable signals 'swen1 and /swen1' in response to activation of a main word line 'MWL'. The second sub-word line driver 12 activates a second sub-word line 'SWL2' in accordance to the control of second positive and negative sub-word line enable signals 'swen2 and /swen2' in response to the activation of the main word line 'MWL'. The third sub-word line driver 13 activates a third sub-word line 'SWL3' in accordance to the control of third positive and negative sub-word line enable signals 'swen3 and /swen3' in response to the activation of the main word line 'MWL'. The fourth sub-word line driver 14 activates a fourth sub-word line 'SWL4' in accordance to the control of fourth positive and negative sub-word line enable signals 'swen4 and /swen4' in response to the activation of the main word line 'MWL'. The first sub-word line share unit 21 allows the first and second sub-word lines 'SWL1 and SWL2' to share a potential level in response to the activation of the main word line 'MWL'. The second sub-word line share unit 22 allows the third and fourth sub-word lines 'SWL3 and SWL4' to share a potential level in response to the activation of the main word line 'MWL'. In this case, the first to fourth positive and negative sub-word line enable signals 'swen<1:4> and /swen<1:4>' are generated from a row decoder. When the first to fourth positive sub-word line enable signals 'swen<1:4>' are enabled, the first to fourth positive sub-word line enable signals 'swen<1:4>' are set at a level of boosted voltage Vpp. When the first is to fourth positive sub-word line enable signals 'swen<1:4>' are disabled, the first to fourth positive sub-word line enable signals 'swen<1:4>' are set at a level of the ground voltage, Vss. The first to fourth negative sub-word line enable signals '/swen<1:4>' are set at a level opposite to that of the first to fourth positive sub-word line enable signals 'swen<1:4>'. Each of the first to fourth sub-word line drivers 11 to 14 activates a corresponding sub-word line SWL<i> when a corresponding positive sub-word line enable signal 'swen<i>' is activated at a high level, and a corresponding negative sub-word line enable signal '/swen<i>' is activated at a low level.

The main word line 'MWL' is set at a low-level potential when the main word line 'MWL' is activated.

The first and second sub-word line share units 21 and 22 are provided between two sub-word lines. Accordingly, when the potential of one of the sub-word lines becomes a floating level, the first and second sub-word line share units 21 and 22 drop the floating level to a low level. If the main word line 'MWL' is activated, the first and second sub-word line share units 21 and 22 disconnect the two sub-word lines from each other. If the main word line 'MWL' is deactivated, the first and second sub-word line share units 21 and 22 connect the two sub-word lines to each other so that the two sub-word lines share the same potential level.

In the semiconductor memory apparatus according to one embodiment, the first and second sub-word line share units 21 and 22 stabilize a potential level of the first to fourth sub-word line 'SWL1 to SWL4' as described above. Accordingly, the first to fourth sub-word line drivers 11 to 14 have less transistors as compared to the number of transistors needed in conventional sub-word line drivers.

Figure 2:
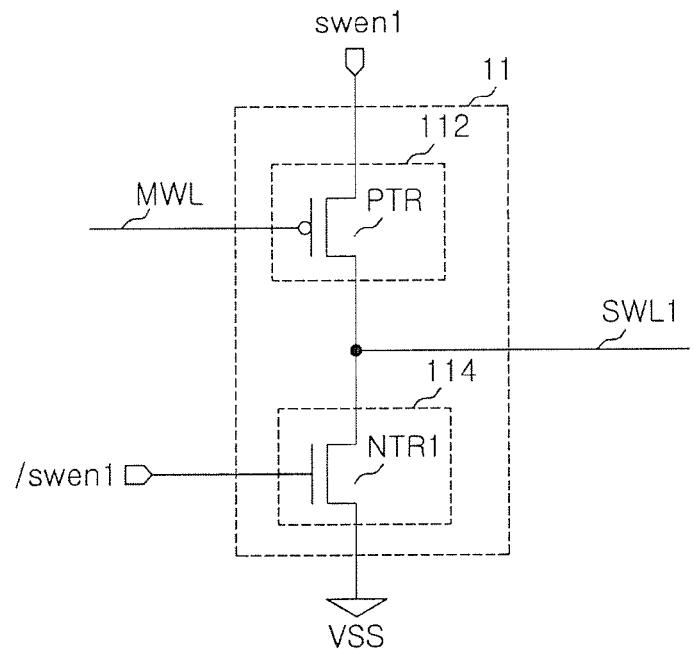
FIG. 2 is a detailed circuit diagram showing an example of a first sub-word line driver of FIG. 1.

FIG. 2 is a detailed circuit diagram showing the first sub-word line driver 11 shown in FIG. 1. Since the first to fourth sub-word line drivers 11 to 14 have the same structure, the first sub-word line driver 11 will be representatively described below.

As shown in FIG. 1, the first sub-word line driver 11 can include a pull-up driver 112 and a pull-down driver 114. The pull-up driver 112 pull-up is configured to drive the first sub-word line 'SWL1' to a potential level of the first positive sub-word line enable signal 'swen1' in response to activation of the main word line 'MWL'. The pull-down driver 114 pull-down is configured to drive the first sub-word line 'SWL1' in response to the first negative sub-word line enable signal '/swen1'.

The pull-up driver 112 can include a PMOS transistor PTR. The PMOS transistor PTR is configured to have a gate terminal connected to the main word line 'MWL', a source terminal receiving the first positive sub-word line enable signal 'swen1', and a drain terminal connected to the first sub-word line 'SWL1'.

The pull-down driver 114 can include a first NMOS transistor NTR1. The first NMOS transistor NTR1 is configured to have a gate terminal receiving the first negative sub-word line enable signal '/swen1', a drain terminal connected to the first sub-word line SWL1, and a source terminal that is grounded.

As described above, the semiconductor memory apparatus according to one embodiment is characterized in that the gate terminal of the first NMOS transistor NTR1 of the pull-down driver 114 provided in the first sub-word line driver 11 receives the first negative sub-word line enable signal '/swen1' instead of being connected with the main word line 'MWL'. Likewise, the second to fourth sub-word line drivers 12 to 14 are configured to have the gate terminals of their NMOS transistors of the pull-down drivers receiving their respective sub-word line enable signals '/swen<2:4>'.

Figure 3:
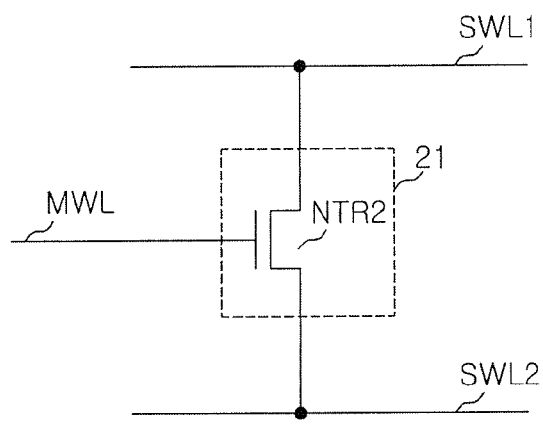
FIG. 3 is a detailed circuit diagram showing an example of a first sub-word line share unit of FIG. 1.

FIG. 3 is a detailed circuit view showing the first sub-word line share unit 21 of FIG. 1. Hereinafter, the first sub-word line share unit 21 will be representatively described.

As shown in FIG. 3, the first sub-word line share unit 21 can include a second NMOS transistor NTR2. The second NMOS transistor NTR2 includes a gate terminal connected to the main word line 'MWL', a drain terminal connected to the first sub-word line 'SWL1', and a source terminal connected to the second sub-word line 'SWL2'.

Accordingly, it will be understood that the second sub-word line share unit 22 includes an NMOS transistor between the third sub-word line 'SWL3' and the fourth sub-word line 'SWL4'.

Figure 4:
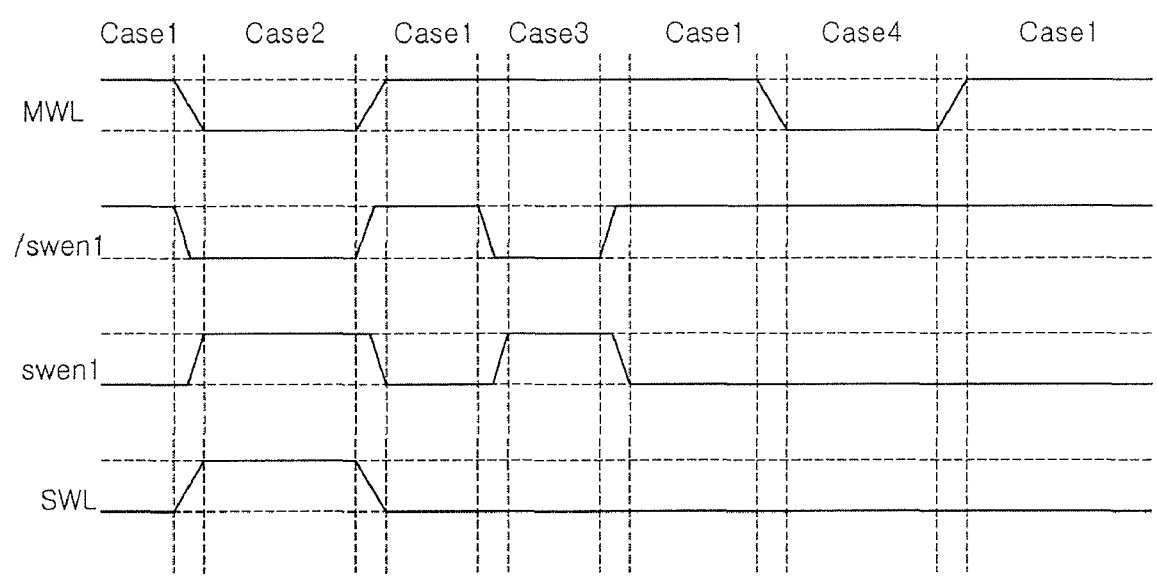
FIG. 4 is a timing chart showing the operation of the first sub-word line driver of FIG. 2.

FIG. 4 is a timing chart showing the operation of the first sub-word line driver of FIG. 2.

As shown in FIG. 4, the operational mode of the semiconductor memory apparatus is divided into four modes Case 1 to Case 4. Variations in a potential level of the main word line 'MWL', the first positive and negative sub-word line enable signals 'swen1 and /swen1', and the first sub-word line 'SWL1' are represented according to each operational mode.

The first mode, i.e., Case 1, represents a pre-charge mode. In this case, the main word line 'MWL' is activated at a high level. In addition, the first positive sub-word line enable signal 'swen1' is disabled at a low level, and the first negative sub-word line enable signal '/swen1' is disabled at a high level.

As a result, the PMOS transistor PTR of the pull-up driver 112 of the first sub-word line driver 11 is turned off, and the first NMOS transistor NTR1 of the pull-down driver 114 is turned on. Accordingly, the first sub-word line 'SWL1' is set at a low-level potential.

The second mode, i.e., Case 2, represents a case in which the first sub-word line 'SWL1' is activated in an active mode. In this case, the main word line 'MWL' is activated at a low level, the first positive sub-word line enable signal 'swen1' is enabled at a high level, and the first negative sub-word line enable signal '/swen1' is enabled at a low level.

As a result, the PMOS transistor PTR of the pull-up driver 112 of the first sub-word line driver 11 is turned on so that the first positive sub-word line enable signal 'swen1', which has a high level, is applied to the source terminal of the PMOS transistor PTR which is delivered to the first sub-word line 'SWL1'. In this case, since the first NMOS transistor NTR1 of the pull-down driver 114 is turned off, the first sub-word line 'SWL1' is activated.

The third mode, i.e., Case 3c, represents a case in which the main word line 'MWL' is deactivated at a high level, the first positive sub-word line enable signal 'swen1' is enabled at a high level, and the first negative sub-word line enable signal '/swen1' is enabled at a low level in the active mode. As a result, the second positive and negative sub-word line enable signals 'swen2 and /swen2' are disabled because only one of a plurality of sub-word lines sharing a main word line is activated in a typical semiconductor memory apparatus.

Accordingly, in case 3, both the PMOS transistor PTR of the pull-up driver 112 of the first sub-word line driver 11 and the first NMOS transistor NTR1 of the pull-down driver 114 are turned off. In this case, the first sub-word line 'SWL1' must be previously pre-charged as shown in FIG. 4. Accordingly, the first sub-word line 'SWL1' already has low-level potential. However, since both of the PMOS transistor PTR of the pull-up driver 112 of the first sub-word line driver 11 and the first NMOS transistor NTR1 of the pull-down driver 114 are turned off, then the first sub-word line 'SWL1' may be at an unknown floating state brought about by noise. However, at this time, as the main word line 'MWL' is deactivated, the second NMOS transistor NTR2 of the first sub-word line share unit 21 is turned on. Accordingly, since the first sub-word line 'SWL1' is connected to the second sub-word line 'SWL2' it then shares a potential level with the second sub-word line 'SWL2'. In this case, since the second positive and negative sub-word line enable signals 'swen2 and /swen2' are disabled, the NMOS transistor of a pull-down driver of the second sub-word line driver 12 is turned on. As a result the potential of the first sub-word line 'SWL1' can be dropped down to a level of the grounded voltage VSS.

Finally, the fourth mode, i.e., Case 4, represents a case in which the main word line 'MWL' is activated at a low level, the first positive sub-word line enable signal 'swen1' is disabled at a low level, and the first negative sub-word line enable signal '/swen1' is disabled at a high level in an active mode.

In this case, both of the pull-up driver 112 of the first sub-word line driver 11 and the first NMOS transistor NTR1 of the pull-down driver 114 are turned on. As a result the first NMOS transistor NTR1 is turned on, and the potential of the first sub-word line 'SWL1' is dropped down to a low level. As the PMOS transistor PTR is turned on, even though a supply terminal of the first positive sub-word line enable signal 'swen1' is connected to the first sub-word line 'SWL1', the first positive sub-word line enable signal 'swen1' is disabled to have low-level potential. Accordingly, the first sub-word line 'SWL1' can have a stable low-level potential.

As described above, in the semiconductor memory apparatus according to one embodiment, a negative sub-word line enable signal is input to a gate terminal of an NMOS transistor of a pull-down driver of a sub-word line driver. As a result, a single sub-word line driver can be made by using only two transistors. In this case, the sub-word line may have a floating level. However, since a sub-word line share unit is provided, and controlled in accordance to activation of a main word line, then the potential of the sub-word line is stabilized. Even though additional transistors are additionally provided when the sub-word line share unit is realized, the number of transistors is reduced because a single sub-word line share unit is provided for two sub-word line drivers. As described above, in the semiconductor memory apparatus according to one embodiment of the present invention, the occupation area of a sub-word line driver can be reduced. Thereby the area margin of the core area can be increased. Accordingly, the whole size of a chip can be reduced.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor memory apparatus comprising:
a sub-word line driver configured to operate in response to an activation of a main word line and in response to positive and negative sub-word line enable signals,
wherein the sub-word line driver includes:
a pull-up driver configured to pull-up drive a first sub-word line to a potential level of the positive sub-word line enable signal in response to the activation of the main word line; and
a pull-down driver configured to pull-down drive the first sub-word line in response to the negative sub-word line enable signal.

2. The semiconductor memory apparatus of claim 1, wherein the positive and negative sub-word line enable signals are generated from a row decoder,
wherein the positive sub-word line enable signal is at a level of a boosted voltage, when the positive sub-word line enable signal is enabled,
wherein the positive sub-word line enable signal is at a level of a ground voltage, when the positive sub-word line enable signal is disabled,
and wherein the negative sub-word line enable signal has a level opposite in magnitude to the level of the boosted voltage of the positive sub-word line enable signal.

3. The semiconductor memory apparatus of claim 1, wherein the pull-up driver includes a PMOS transistor configured to have a gate terminal connected to the main word line, a source terminal configured to receive the positive sub-word line enable signal, and a drain terminal connected to the first sub-word line.

4. The semiconductor memory apparatus of claim 1, wherein the pull-down driver includes an NMOS transistor configured to have a gate terminal configured to receive the negative sub-word line enable signal, a drain terminal connected to the first sub-word line, and a source terminal that is grounded.

5. The semiconductor memory apparatus of claim 1, further comprising a sub-word line share unit configured to allow the first sub-word line and a second sub-word line adjacent to the first sub-word line to share a potential in response to the activation of the main word line.

6. The semiconductor memory apparatus of claim 5, wherein the sub-word line share unit disconnects the first sub-word line from the second sub-word line when the main word line is activated, and wherein the sub-word line share unit connects the first sub-word line to the second sub-word line when the main word line is deactivated so that the first sub-word line and the second sub-word line share a potential level.

7. A semiconductor memory apparatus comprising:
a first sub-word line driver configured to activate a first sub-word line in accordance to first positive and negative sub-word line enable signals in response to activation of a main word line;
a second sub-word line driver configured to activate a second sub-word line in accordance to control of second positive and negative sub-word line enable signals in response to the activation of the main word line; and
a sub-word line share unit configured to allow the first sub-word line and the second sub-word line to commonly share a potential in response to the activation of the main word line.

8. The semiconductor memory apparatus of claim 7, wherein the first and second positive and negative sub-word line enable signals are generated from a row decoder,
wherein the first and second positive sub-word line enable signals have a level of a boosted voltage when the first and second positive sub-word line enable signals are enabled,
wherein the first and second positive sub-word line enable signals have a level of ground voltage when the first and second positive sub-word line enable signal are disabled
and wherein the first and second negative sub-word line enable signals have levels opposite in magnitude to levels of the first and second positive sub-word line enable signals.

9. The semiconductor apparatus of claim 7, wherein the first sub-word line driver includes:
a pull-up driver configured to pull-up drive the first sub-word line in response to activation of the main word line and in response to the first positive sub-word line enable signal; and
a pull-down driver configured to pull-down drive the first sub-word line in response to the first negative sub-word line enable signal.

10. The semiconductor apparatus of claim 7, wherein the second sub-word line driver includes:
a pull-up driver configured to pull-up drive the second sub-word line in response to activation of the main word line and in response to the second positive sub-word line enable signal; and
a pull-down driver configured to pull-down drive the second sub-word line in response to the second negative sub-word line enable signal.

11. The semiconductor memory of claim 7, wherein the sub-word line share unit disconnects the first sub-word line from the second sub-word line when the main word line is activated, and the sub-word line share unit connects the first sub-word line to the second sub-word line when the main word line is deactivated so that the first sub-word line and the second sub-word line share a potential level.

* * * * *